(12) United States Patent
Guenther et al.

(10) Patent No.: US 7,026,660 B2
(45) Date of Patent: Apr. 11, 2006

(54) INTERCONNECTION FOR ORGANIC DEVICES

(75) Inventors: Ewald Guenther, Regenstauf (DE); Hooi Bin Lim, Penang (MY); Shahrol Izzanni Abdul Manaf, Penang (MY); Stefan Eigenbrodt, Penang (MY); Soong Lin Teng, Penang (MY)

(73) Assignee: Osram Opto Semiconductors (Malaysia) Sdn. Bhd, Penang (MY)

( * ) Notice: Subject to any disclaimer, the term of this patent is extended or adjusted under 35 U.S.C. 154(b) by 0 days.

(21) Appl. No.: 10/249,625

(22) Filed: Apr. 25, 2003

(65) Prior Publication Data

US 2004/0211966 A1    Oct. 28, 2004

(51) Int. Cl.
*H01L 33/00* (2006.01)
*H01L 35/24* (2006.01)
*H01L 51/00* (2006.01)

(52) U.S. Cl. ............................. 257/100; 257/40; 257/99
(58) Field of Classification Search ................. 257/40, 257/99–100; 438/22, 82, 99
See application file for complete search history.

(56) References Cited

U.S. PATENT DOCUMENTS

| | | | |
|---|---|---|---|
| 6,210,815 B1 * | 4/2001 | Ooishi | 428/690 |
| 6,307,218 B1 * | 10/2001 | Steigerwald et al. | 257/99 |
| 6,548,912 B1 * | 4/2003 | Graff et al. | 257/787 |
| 6,624,572 B1 * | 9/2003 | Kim et al. | 313/512 |
| 6,656,828 B1 * | 12/2003 | Maitani et al. | 438/613 |
| 6,661,029 B1 * | 12/2003 | Duggal | 257/89 |
| 2001/0017516 A1 | 8/2001 | Gonther | |
| 2002/0074938 A1 * | 6/2002 | Gu | 313/512 |
| 2003/0045016 A1 | 3/2003 | Saito et al. | |
| 2003/0094591 A1 | 5/2003 | Auch et al. | |
| 2003/0143423 A1 * | 7/2003 | McCormick et al. | 428/690 |
| 2003/0209979 A1 | 11/2003 | Guenther et al. | |
| 2003/0214232 A1 * | 11/2003 | Guenther et al. | 313/512 |

FOREIGN PATENT DOCUMENTS

| | | |
|---|---|---|
| JP | 02-135694 A | 5/1990 |
| JP | 2001015268 A | 1/2001 |
| JP | 2003017253 A | 1/2003 |
| WO | WO 01/44865 A1 | 6/2001 |
| WO | WO 01/45140 A2 | 6/2001 |
| WO | WO 02/21883 A1 | 3/2002 |

* cited by examiner

*Primary Examiner*—Shouxiang Hu
(74) *Attorney, Agent, or Firm*—Fish & Richardson P.C.

(57) ABSTRACT

A device having bond pads within a bond pad region, the bond pads comprising a conductive material that is stable when exposed to atmospheric constituents. The bond pads can be formed from conductive oxide materials such as indium tin oxide. A contact layer is provided to enhance the conductivity between the bond pads and the active component of the device.

20 Claims, 9 Drawing Sheets

INTERCONNECTION FOR ORGANIC DEVICES

BACKGROUND OF INVENTION

OLED devices can serve as displays for various types of consumer electronic products, such as automobile stereo displays, cellular phones, cellular smart phones, personal organizers, pagers, advertising panels, touch screen displays, teleconferencing and multimedia products, virtual reality products and display kiosks. Referring to FIG. 1, a conventional OLED device 100 is shown. The OLED device comprises a functional stack formed on a substrate 101. The functional stack comprises one or more organic functional layers 102 between a transparent first conductive layer 104 (e.g., indium tin oxide or ITO) and a second conductive layer 106. The conductive layers serve as electrodes. OLED cells are located in the active region where the cathodes and anodes overlap. A cap 160 may be provided to hermetically seal the active components. A contact layer 150 can be formed over the first conductive layer, the contact layer extending to the exterior of the encapsulation for providing external bond pads 151. Charge carriers are injected through the cathodes and anodes via bond pads 151 for recombination in the functional organic layers. The recombination of the charge carriers causes the functional layers of the cells to emit visible radiation.

FIG. 2 shows a section of the interconnection between the bond pads and external driving circuitry in conventional OLED devices. A flex connector 206 is bonded to the substrate 101 using, for example, an anisotropic conducting film (ACF) 208. The flex connector provides the external electrical interconnection from the device to the driving circuitry, which provides the current for driving the active components. A contact layer 150 is deposited on the substrate, and used to provide the electrical interconnection between the device and the flex connector. The contact layer comprises a metal such as Al, Au, Ag, Cu, Cr or Ni.

However, the contact layer is exposed to the environment at portions such as 210, and is highly susceptible to damage caused by reaction with atmospheric components such as oxygen and water. The flex connector may be de-bonded from the contact layer over time, degrading the reliability of the interconnection. Moreover, the contact layer exhibits poor adhesion to the substrate and ACF, leading to low reliability, difficult processing and higher production costs.

As evidenced from the foregoing discussion, it is desirable to provide an improved interconnection to increase the reliability and lifetime of a device.

SUMMARY OF INVENTION

The invention relates to improved interconnection of devices, such as OLED devices. A bond pad region is provided, the bond pad region having bond pads comprising a conductive material that is stable when exposed to atmospheric constituents such as water and oxygen. The bond pads can comprise a conductive oxide material such as indium tin oxide. A contact layer is provided to enhance conductivity between the bond pads and the active component of the device. The contact layer, in one embodiment, is encapsulated by a protection layer.

DETAILED DESCRIPTION

Figure 1:
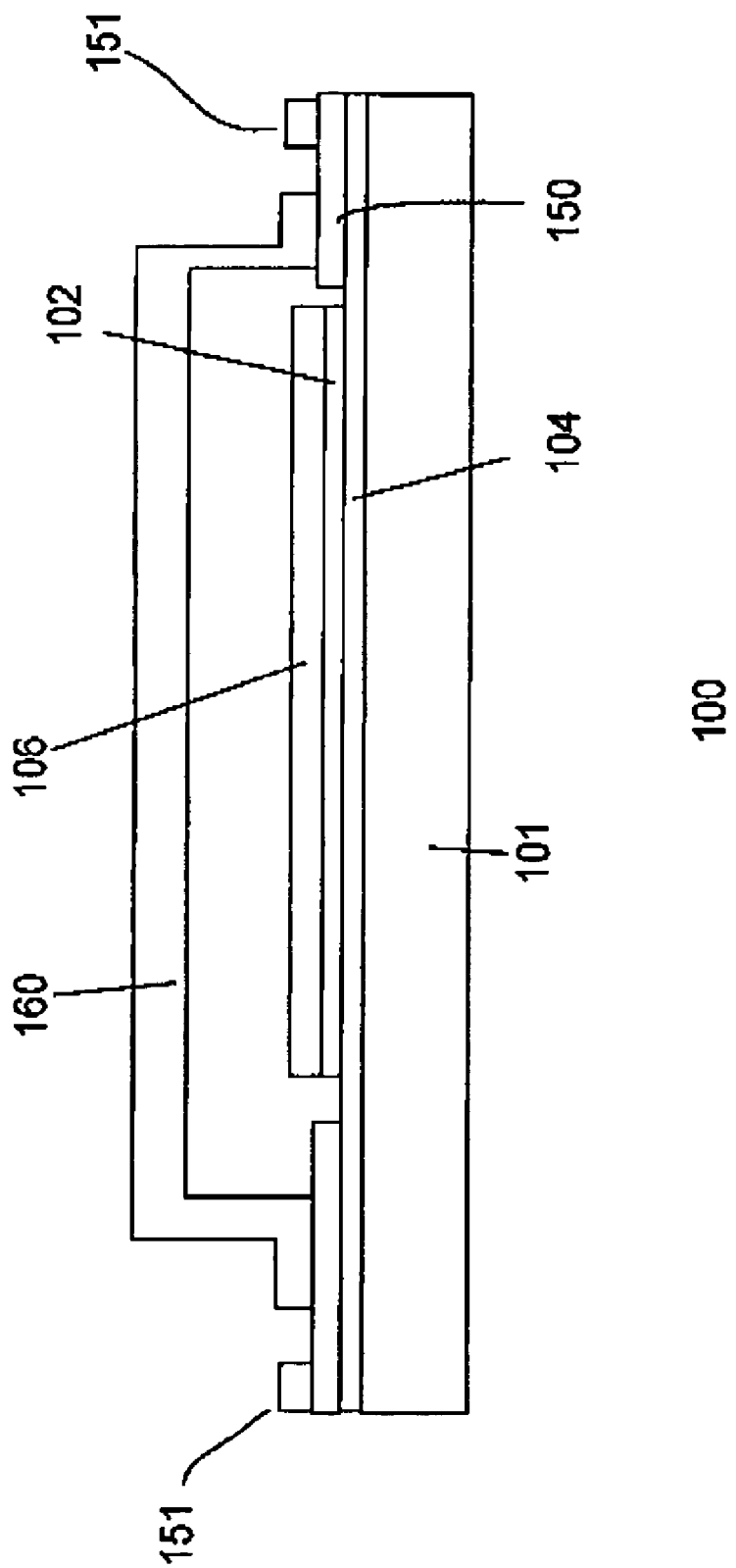
FIG. 1 shows a conventional OLED device.
Figure 2:
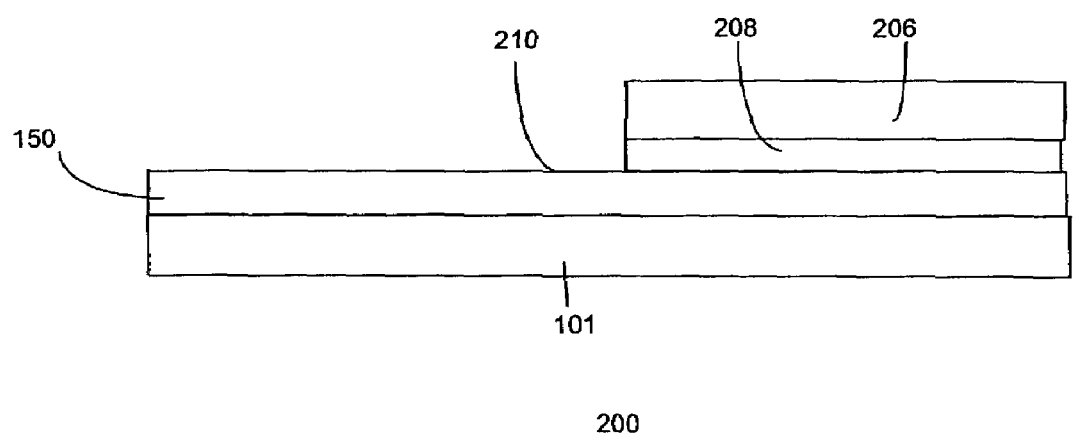
FIG. 2 shows the interconnection between bond pads and external driving circuitry in conventional OLED devices.
Figure 3:
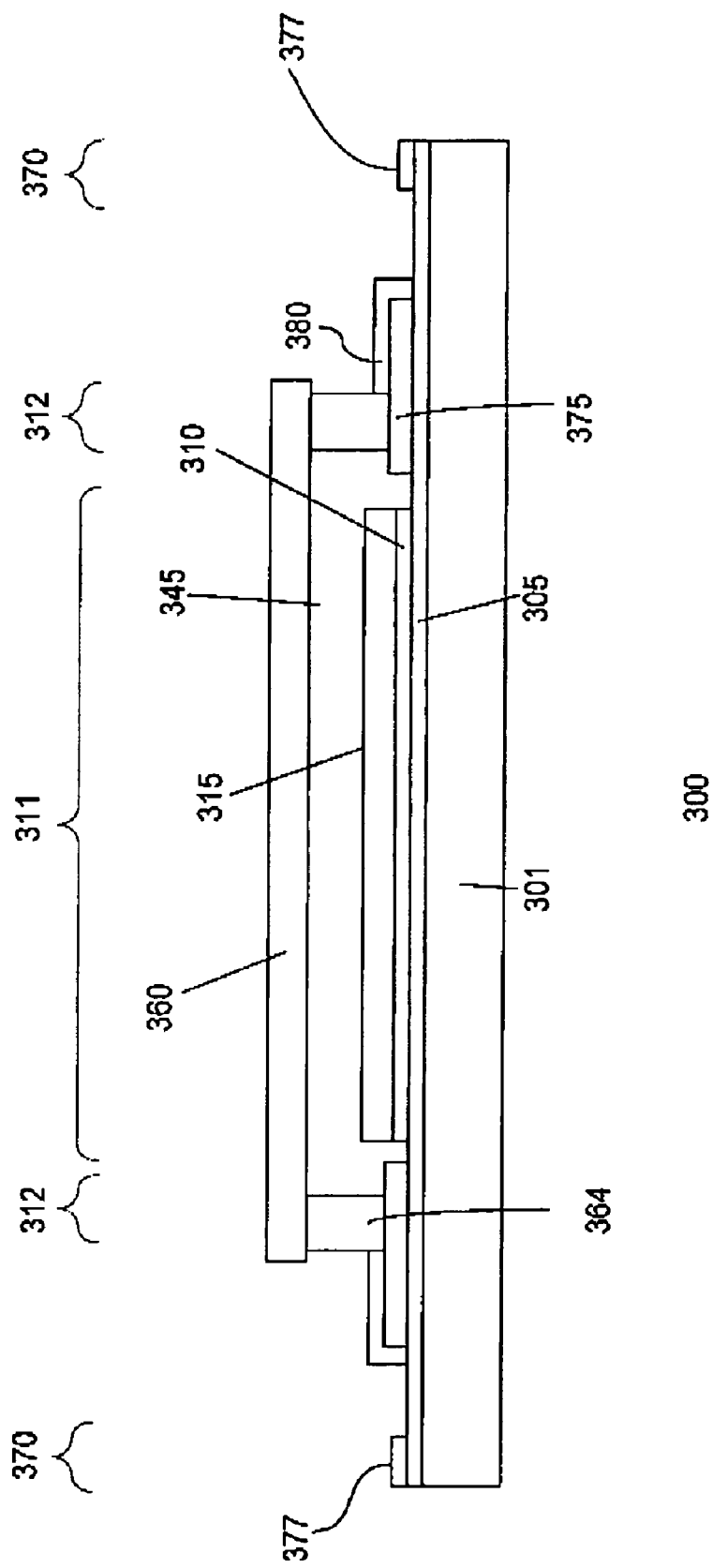
FIG. 3 shows an organic device 300 in accordance with one embodiment of the invention.

The invention relates to improved interconnection of devices. The interconnection results in devices which are more reliable and relatively inexpensive to produce. FIG. 3 shows a device 300 in accordance with one embodiment of the invention. In one embodiment, the device comprises a substrate 301 having an active region 311 defined thereon. The substrate comprises, for example, glass. Materials, such as silicon or other semiconductor materials, are also useful. To form flexible devices, materials such as plastics, can be used. Various other materials, which can provide sufficient mechanical stability for forming the device, are also useful.

The active region comprises one or more active components of the device. In one embodiment, the active region comprises one or more OLED cells. The active region may also comprise other types of electronic components. An OLED cell comprises one or more organic layers (polymer stack) 310 sandwiched between first and second electrodes (305 and 315). The electrodes are formed of conductive layers. The organic layers are fabricated from organic compounds that include, for example, conjugated polymers, low molecular materials, oligomers, starburst compounds or dendrimer materials. Such materials include tris-(8-hydroxyquinolate)-aluminum (Alq), poly(p-phenylene vinylene) (PPV) or polyfluorene (PF). Other types of functional organic layers, including fluorescence or phosphorescence-based layers, are also useful.

In one embodiment, at least one of the electrodes comprises a conductive material which is stable when exposed to atmospheric constituents, such as water and oxygen. In one embodiment, the first electrode comprises a conductive material that is stable when exposed to atmospheric constituents. In one embodiment, the stable conductive material comprises a conductive oxide such as indium tin oxide (ITO). Other conductive oxides such as indium zinc oxide, zinc oxide or tin oxide, or other conductive materials which are stable when exposed to atmospheric constituents are also useful. In one embodiment, the first electrode comprises a transparent conductive material. For applications which view through the substrate, the first transparent electrode is located on the substrate, as shown in FIG. 3. For applications which view through the cap, the transparent electrode is positioned on top of the organic layer 310. The first electrode serves as, for example, the anode while the second electrode serves as, for example, the cathode.

The cathodes and anodes can be patterned as desired to form one or more OLED cells in passive display applications. For example, the cathodes and anodes are formed as strips in respective first and second directions, creating a pixelated device. Other patterns are also useful. Typically, the first and second directions are orthogonal to each other. Alternatively, the OLED display comprises an active-matrix display. The active-matrix display comprises pixels that are independently addressed by thin-film-transistors (TFTs) and capacitors formed in an electronic backplane.

In one embodiment, a cap 360 is bonded to the substrate in the cap bonding region 312 surrounding the active region, encapsulating the OLED cells. The cap creates a cavity 345 to protect the cells from being damaged by physical contact with the cap. In one embodiment, the cap comprises a cap substrate with a sealing rim or gasket 364 formed thereon. The cap substrate can be formed from, for example, glass. Other materials which can serve as a cap substrate, such as metal or ceramic, can also be used. The sealing rim, for example, can be formed from photoresist. Other types of materials, such as silicate glass, silicon-dioxide, or ceramic can also be used. An adhesive may be used to bond the cap to the substrate. The adhesive, for example, comprises resins based on epoxy, silicone, urethane, acrylate or olefinic chemistries. The resin can be a UV or thermally curable resin. Providing a sealing rim formed from an epoxy adhesive is also useful. Alternatively, the cap is a pre-formed cap comprising, for example, pressed metal or etched glass.

The active region of the device can, for example, include shaped pillars. The shaped pillars, which comprise an undercut, are used to pattern the top electrodes. The use of shaped pillars is described in, for example, "Production of Structured Electrodes" (US 2001/0017516A1) and "Patterning of Electrodes in OLED Devices" (PCT/SG00/00134), which are herein incorporated by reference for all purposes. Alternatively or in addition to shaped pillars, spacer particles can be provided on the substrate. The spacer particles serve to support the cap, preventing it from contacting the OLED cells. The use of spacer particles is described in, for example, "Encapsulation of Electronic Devices"(U.S. Ser. No. 09/989,362); "Improved Encapsulation of Organic LED devices" (PCT/SG99/00145); "Organic LED Device with Improved Encapsulation" (PCT/SG99/00143); and "Improved Encapsulation for Organic LED Device" (PCT/SG99/00145), which are herein incorporated by reference for all purposes.

A surface protection layer (not shown) may be provided on the substrate in the cap bonding area. The cap contacts the surface protection layer. Various layers beneath the surface protection layer, for example, metal interconnects for the electrodes and/or electrodes (e.g., ITO), are protected from damage during removal of the polymer material. The use of a surface protection layer is described in, for example, patent application titled "Encapsulation for Electroluminescent Devices" U.S. Ser. No. 10/142,208, which is herein incorporated by reference for all purposes.

A bond pad region 370 is provided in which bond pads 377 are located. In one embodiment, the bond pad region surrounds the active area and extends beyond the cap bonding region. Providing a bond pad region which surrounds the cap bonding region is also useful. A bond pad includes first (lead) and second (pad) regions. The pad region is where contact is made to, for example, driving circuitry. Typically, the lead portion extends from the pad portion toward the active region.

In accordance with the invention, the bond pads comprise a conductive material that is stable when exposed to atmospheric constituents, such as water and air. In one embodiment, the conductive material comprises a conductive oxide. For example, the conductive oxide comprises indium tin oxide, indium zinc oxide, zinc oxide or tin oxide. Other types of conductive oxides or conductive materials which are stable when exposed to atmospheric constituents are also useful.

In a preferred embodiment, the bond pads and first electrodes are formed from the same conductive layer. Forming bond pads and first electrodes from different layers and/or materials are also useful. The conductive layer that forms the bond pads and first electrodes, in one embodiment, comprises a conductive oxide which is stable conductive material. Preferably, the conductive material of the bond pads and first electrodes exhibits good adhesion to the substrate as well as to the connector coupled to the driving circuitry. This improves the reliability of the interconnection.

The lead portion of the bond pads can be directly (e.g., part of) or indirectly (e.g., separated from) the active components (e.g., electrodes). As an example, the lead portion of the bond pads which are to be coupled to the first electrode can be integrated as part of the first electrode (e.g., formed from the same layer) while the bond pads which are to be coupled to the second electrodes are indirectly coupled to the second electrodes.

In one embodiment of the invention, contact conductors 375 are provided. The contact conductors serve to electrically couple the bond pads 377 to the active components and/or enhances the connectivity therebetween. The conductor preferably comprises a conductive metal (e.g. Al, Au, Ag, Cu, Cr or Ni). Other conductive materials are also useful. The conductors comprise a dimension which is sufficient to produce the desired electrical characteristics. Typically, the thickness of the conductors is about 100–1000 nm. Other thicknesses are also useful.

In one embodiment, a protection layer 380 is provided to encapsulate the conductors, protecting them from exposure to atmospheric constituents that may cause damage or corrosion. The protection layer preferably comprises an insulating material, such as photoresist, novolak resin, polyimide or polybenzoxazole may be used. Other types of materials which protect the contact layer from the atmospheric constituents are also useful.

The contact conductors, in one embodiment, do not extend into pad portion of the bond pads. For example, the conductors contact the lead portions of the bond pads and the active components. Preferably, the contact conductors terminate sufficiently before the pad portion to enable the conductors to be completely encapsulated without covering the pad portions, allowing interconnections between the pad portions and connectors. Hence, the conductors are not exposed to detrimental reaction with atmospheric constituents such as water or oxygen.

Figure 4:
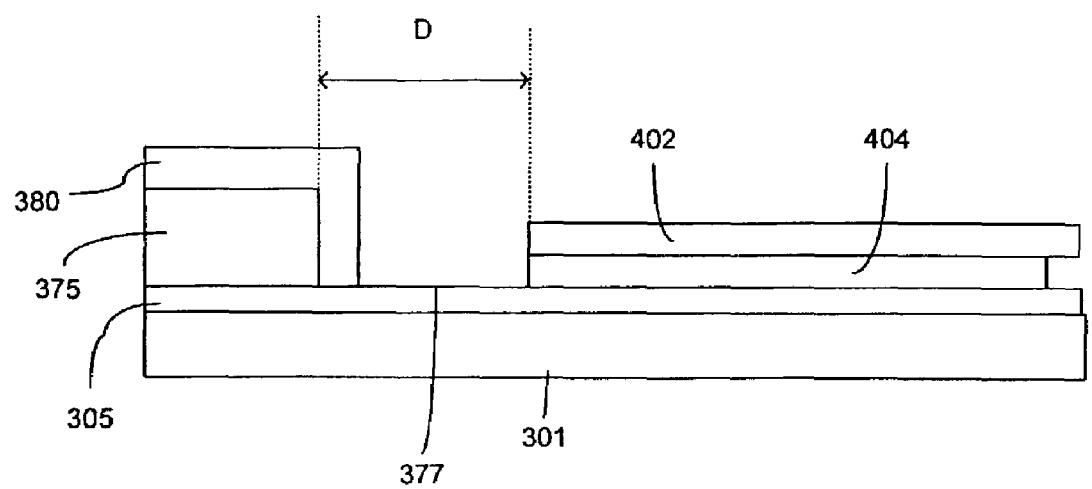
FIG. 4 shows the interconnection between the contact layer, interconnecting materials and driving circuitry in accordance with one embodiment of the invention.

FIG. 4 shows the interconnection of the conductors to the driving circuitry in one embodiment of the invention. The interconnecting materials comprise, for example, a flex connector 402 bonded to the substrate. Other types of connectors are also useful. In one embodiment, the flex connector is bonded to the substrate using an anisotropic conducting film (ACF) 404. Other techniques for bonding the flex connector are also useful. The flex connector comprises, for example, conductive traces (e.g. copper) that lead to the driving circuitry that provides the control signals for driving the device. The ACF typically comprises an adhesive with interspersed conductive particles that provide a conductive path between the traces on the flex connector and the pad portions of the bond pad once compressed. The conductive particles typically comprise, for example, carbon fiber, metal or metal-coated plastic. The adhesive material typically comprises thermoplastic materials (e.g. polyvinyl butylene), thermosetting materials (e.g. epoxy resin, acrylic resin or polyurethane) or a combination thereof.

Since the resistance of the bond pad material has a higher sheet resistance than the contact conductors 375, there exists a voltage drop. In a preferred embodiment, the distance D between the contact conductors and the pad portion of the bond pads is sufficiently small to minimize the voltage drop. More preferably, the distance is sufficiently small to maintain the desired electrical characteristics. In one embodiment, the voltage drop between the conductor and pad portions of the bond pads is less than about 0.25 V. Other levels of voltage drop can also be useful, depending on design requirements. To provide a voltage drop less than 0.25 V, D should be less than 0.25 mm. Other distances that provide acceptable drops in voltage can also be useful.

Figure 5:
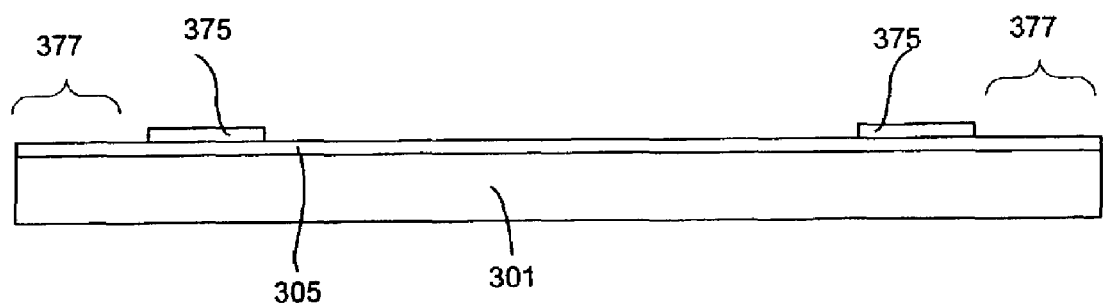
FIGS. 5–9 show a process for fabricating an OLED device in one embodiment of the invention.

FIGS. 5–9 show a process for fabricating an OLED device in accordance with one embodiment of the invention. Referring to FIG. 5, a substrate 301 is provided. In one embodiment, the substrate comprises a transparent substrate, for example, soda lime or borosilicate glass. Other types of transparent materials can also be used to serve as the substrate. The use of non-transparent substrates is also useful, depending on the application. The substrate is typically about 0.4 1.1 mm thick.

In another embodiment, the substrate comprises a thin flexible substrate. Thin flexible substrates are formed from, for example, plastic films such as transparent poly (ethylene terephthalate) (PET), poly (butylene terephalate) (PBT), poly (ethylene napthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methacrylate) (PMMA), can also be used to form the substrate. Alternatively, materials such as ultra thin glass (e.g., thickness between 10–100 um), a composite stack comprising glass and colymer or polymer films coated with inorganic barrier layers can also be used.

In a preferred embodiment, a first conductive layer 305 is provided on the substrate. The first conductive layer is patterned to create first electrodes and bond pads. The first electrodes serves as, for example, anodes. Various techniques, such as photolithography, can be used to pattern the conductive layer. The anodes can be formed by, depositing and patterning a conductive layer on the substrate. In one embodiment, the anodes are arranged in strips in a first direction. Anodes having other patterns are also useful. In one embodiment, the conductive material comprises a transparent conductive material such as indium-tin-oxide (ITO). Other transparent conductive materials, for example, indium-zinc-oxide, zinc oxide or tin oxide, are also useful. Providing first electrodes and bond pads formed using different conductive layers is also useful.

In one embodiment, a contact conductive layer is deposited on the first conductive layer. The contact conductive layer comprises, for example, a conductive metal such as Al, Au, Ag, Cu, Cr or Ni. Other conductive materials are also useful. The contact conductive layer is patterned to form contact conductors 375. Patterning of the contact conductor layer can be achieved using conventional lithographic techniques, such as masking and etching. The contact layer serves to couple and/or enhance the conductivity between the active components and bond pads. In one embodiment, the contact layer contact the lead portion of the bond pads, leaving the pad portion exposed. Preferably, a sufficient portion of the pad portion is exposed to enable the coupling between a connector to the pad portion.

In an alternative embodiment, the conductors are formed later on in the process flow. For example, the conductors are formed after the cells are formed but prior to encapsulation. The conductors can be formed to create coupling to, for example, top electrodes and to enhance the conductivity to the bond pads.

Figure 6:
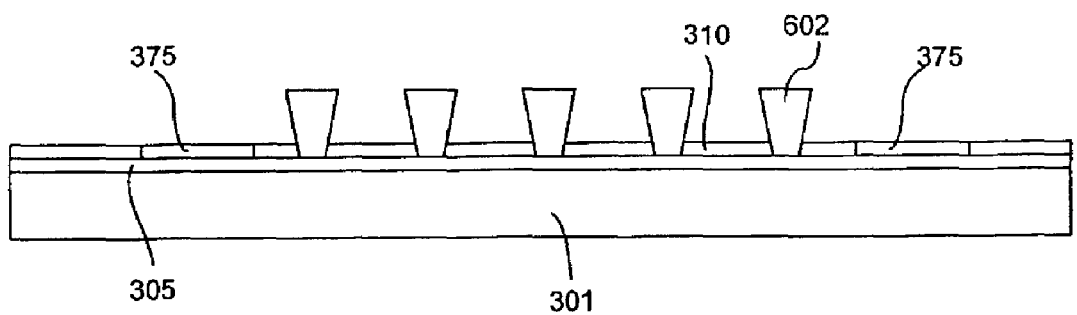

Referring to FIG. 6, the process continues to complete the fabrication of the OLED device. Various conventional techniques can be used to complete the OLED cells. In one embodiment, shaped pillars 602 are formed on the substrate. The shaped pillars comprise an undercut, for example a v-shape profile, to sufficiently interrupt the conductive layer during deposition to form the electrodes. Preferably, the shaped pillars are formed from a single layer of material. In one embodiment, the shaped pillars are formed from a single layer comprising a negative photoresist. Other types of photosensitive materials can also be used. Non-photosensitive materials can also be used to form shaped pillars. Alternatively, the shaped pillars are formed from multiple layers to create a t-shaped profile. The multiple layers can be formed from photosensitive and/or non-photosensitive materials.

After the pillars are formed, a functional organic layer 310 is deposited on the substrate. In one embodiment, the functional organic layer comprises a conjugated polymer. Other types of polymer materials are also useful. The polymer is deposited by, for example, spin-coating. Other deposition techniques can also be used. Additional functional layers can be deposited to form a functional organic stack. Different types of polymers can be deposited to form a multi-color OLED device.

Figure 7:
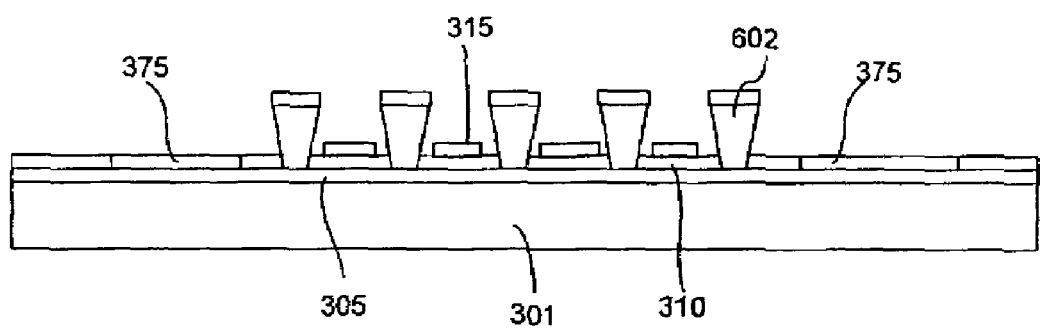

Referring to FIG. 7, a second conductive layer 315 is deposited on the substrate to serve as second electrodes. The conductive layer comprises, for example, Ca, Mg, Ba, Ag, Al or a mixture or alloy thereof. Other conductive materials, particularly those comprising a low work function, can also be used to form the second conductive layer. Alternatively, the second conductive layer comprises an ionic compound, such as LiF, MgF, or CsF. In one embodiment, the second conductive layer comprises Ca. The Ca layer is deposited by, for example, thermal evaporation at a rate of 1 nm/s and a pressure of about $10^{-5}$ mbar. Alternatively, the second conductive layer comprises a composite layer or stack of multiple conductive layers. For example, the stack comprises a first layer of Ca followed by a second conductive layer of Ag or Al. Various deposition techniques, such as, thermal evaporation, sputtering (PVD), chemical vapor deposition (CVD), plasma enhanced chemical vapor deposition (PECVD) or metal organic chemical vapor deposition (MOCVD), can be used to form the second conductive layer. Preferably, a shadow mask is used to deposit the second conductive layer in the active area of the device. The deposition of the second conductive layer is interrupted by the pillars, creating second electrodes or cathodes. The intersections of the cathodes and anodes form OLED cells.

In one embodiment, the polymer layer outside the active region is removed or etched by, for example, laser ablation. In one embodiment, the polymer is removed prior to the formation of second electrodes. Patterning the polymer layer after formation of the second electrodes can also be useful. A surface protection layer (not shown) may be used to protect the underlying contact layer and/or first conductive layer.

Figure 8:
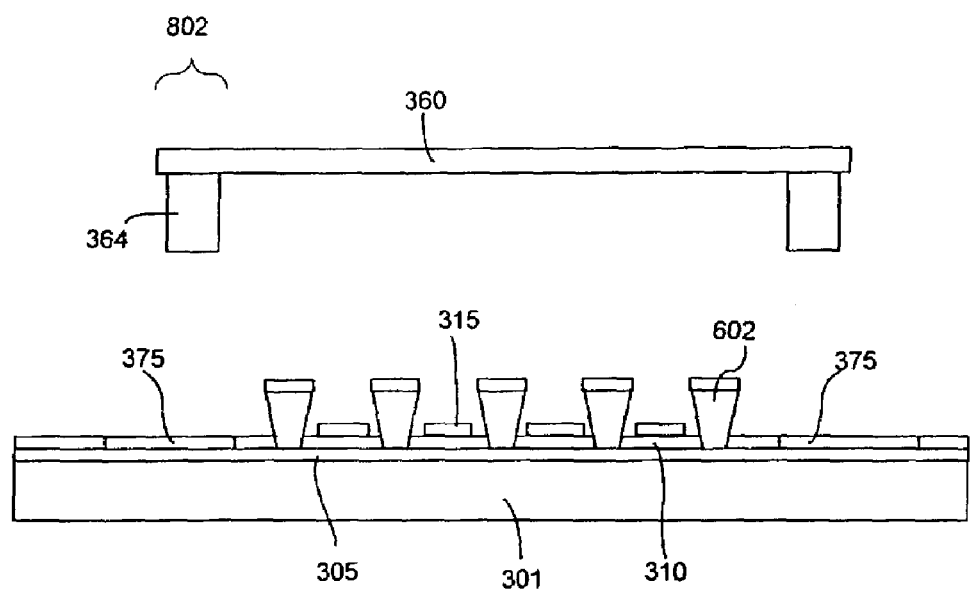

As shown in FIG. 8, a cap 360 is mounted on the substrate in the cap bonding region 802. The cap sealing rim 364 forms an interface between the cap and substrate. An adhesive resin can be used to bond the cap to the substrate. In one embodiment, the adhesive exhibits good bonding and barrier property between the substrate and cap to hermetically seal the OLED cells. Various types of resins, such as those based on epoxies, silicones, urethanes, acrylates or olefins can be used. The resin can either be a UV or thermally curable resin.

Figure 9:
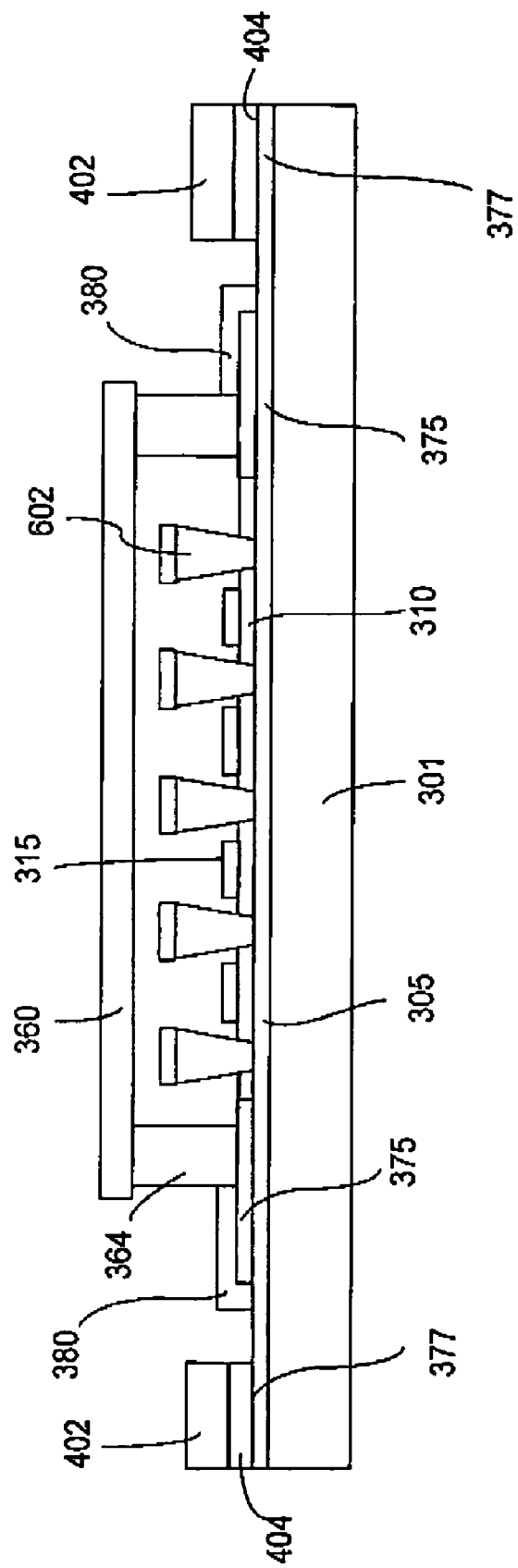

After the OLED device is encapsulated as shown in FIG. 9, the polymer material outside the active area can be removed to expose the bond pads using, for example, a wet etch. Since the active area of the device is sealed, the chemicals will not adversely impact the OLED cells. A protection layer 380 is selectively deposited on the contact layer 375 outside the cap bonding region to encapsulate the contact layer. Alternatively, the protection layer is selectively deposited to protect the conductors earlier in the process flow after the conductors are formed and prior to encapsulation. The protection layer may be deposited by, for example, conventional lithographic techniques. For example, the protection layer can be created after the coupling to the active components are created but prior to encapsulation.

Interconnecting materials are attached on the substrate to provide the electrical connection to external driving circuitry. In one embodiment, an ACF 404 is deposited on the first conductive layer 377. The ACF comprises, for example, a thermosetting adhesive with interspersed metal-coated plastic particles. In one embodiment, a flex connector 402 is aligned and bonded to the substrate using the ACF.

The invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

The invention claimed is:

1. A device comprising:
    a substrate having an active region defined thereon, the active region comprising at least one active component;
    a cap bonding region surrounding the active region;
    a bond pad region adjacent to the active region, wherein the bond pad region comprises bond pads which are electrically coupled to the active component through an electrical connection formed of a conductive film;
    a contact conductor that is electrically coupled to at least one of the bond pads and to the active component, wherein the contact conductor does not directly contact the bond pads, and the contact conductor enhances conductance between said at least one of the bond pads and the active component beyond the conductance along the electrical connection;
    a cap bonded so the substrate in the cap bonding region with the contact conductor being disposed between the cap and the cap bonding region, the cap encapsulating the active region, wherein a portion of the contact conductor extends outside the cap; and
    an insulating protective layer in direct contact with at least a portion of the contact conductor that extends outside the cap, wherein the insulating protective layer has no direct contact with the bonding pads;
    wherein the active component comprises at least one OLED cell; and
    wherein the active component, the bonding pads and that contact conductor are formed on the conductive film.

2. The device of claim 1 wherein the bond pads comprise a stable conductive oxide material.

3. The device of claim 2 wherein the contact conductor comprises a conductive metal.

4. The device of claim 1 wherein the bond pads comprise a conductive oxide material.

5. The device of claim 4 wherein the contact conductor comprises a conductive metal.

6. The device of claim 1 wherein the contact conductor comprises a conductive metal.

7. The device of claim 1 wherein the protective layer protects the portion of the contact conductor that extends outside the cap bonding region from damage or corrosion due to exposure to atmospheric constituents.

8. The device of claim 7 wherein the protective layer comprises photoresist, novolak resin, polyimide or polybenzoxazole.

9. The device of claim 1, wherein the insulating protective layer encapsulates the portions of the contact conductor that extend outside the cap.

10. The device of claim 1, wherein the conductive film is transparent.

11. A device comprising:
    a substrate having an active region defined thereon, the active region comprising at least one active component;
    a cap bonding region surrounding the active region;
    a bond pad region adjacent to the cap bonding region, wherein the bond pad region comprises bond pads electrically coupled to the active component through an electrical connection formed of a conductive film;
    a contact conductor that is electrically coupled to the bond pads and the active component, wherein the contact conductor does not directly contact the bond pads, and the contact conductor enhances conductance between the bond pads and the active component beyond the conductance along the electrical connection;
    a cap bonded to the substrate in the cap bonding region to encapsulate the active region with the contact conductor being disposed between the cap and the cap bonding region, wherein a portion of the contact conductor extends outside the cap bonding region; and
    a protection layer directly contacting at least a portion of the contact conductor extending outside the cap bonding region, the contact conductor spaced a distance less than about 0.25 mm from the bond pads, wherein the protective layer has no direct contact with the bonding pads;
    wherein the active component comprises at least one OLED cell; and
    wherein the active component, the bonding pads and the contact conductor are formed on tho conductive film.

12. The device of claim 11 wherein the bond pads comprise a conductive oxide material.

13. The device of claim 11 wherein the bond pads comprise a stable conductive oxide material.

14. The device of claim 11 wherein the protection layer protects the portion of the contact conductor that extends outside the cap bonding region from damage or corrosion due to exposure to atmospheric constituents.

15. The device of claim 14 wherein the protection layer comprises an insulating material.

16. The device of claim 15 wherein the protection layer comprises photoresist, novolak resin, polyimide or polybenzoxazole.

17. The device of claim 14 wherein the protection layer comprises photoresist, novolak resin, polyimide or polybenzoxazole.

18. The device of claim 11 wherein the protection layer encapsulates the portions of the contact conductor extending outside the cap bonding region.

19. The device of claim 11 wherein the contact conductor does not extend ever the bond pad region.

20. The device of claim 11 wherein the conductive film is transparent.

* * * * *

UNITED STATES PATENT AND TRADEMARK OFFICE
CERTIFICATE OF CORRECTION

| | | |
|---|---|---|
| PATENT NO. | : 7,026,660 B2 | |
| APPLICATION NO. | : 10/249625 | |
| DATED | : April 11, 2006 | |
| INVENTOR(S) | : Ewald Karl Michael Guenther et al. | |

It is certified that error appears in the above-identified patent and that said Letters Patent is hereby corrected as shown below:

On the Title Page, (56) References Cited, U.S. PATENT DOCUMENTS; replace:

"2003/0094591 A1    5/2003 Auch et al." with
-- 2003/0094691 A1    5/2003 Auch et al. --

Column 7, Line 45 at Claim 1; replace:

"a cap bonded so the substrate" with
-- a cap bonded to the substrate --

Column 7, Line 46 at Claim 1; replace:

"being disposed between thc" with
-- being disposed between the --

Column 7, Line 55 at Claim 1; replace:

"the bonding pads and that" with
-- the bonding pads and the --

Column 8, Line 40 at Claim 11; replace:

"contact conductor are formed on tho" with
-- contact conductor are formed on the --

UNITED STATES PATENT AND TRADEMARK OFFICE
CERTIFICATE OF CORRECTION

PATENT NO.       : 7,026,660 B2
APPLICATION NO.  : 10/249625
DATED            : April 11, 2006
INVENTOR(S)      : Ewald Karl Michael Guenther et al.

It is certified that error appears in the above-identified patent and that said Letters Patent is hereby corrected as shown below:

Column 8, Line 62 at Claim 19; replace:

"does not extend ever the bond region" with
-- does not extend over the bond region --

Signed and Sealed this

First Day of April, 2008

JON W. DUDAS
*Director of the United States Patent and Trademark Office*